United States Patent [19]

Johnson et al.

[11] Patent Number: 5,502,330
[45] Date of Patent: Mar. 26, 1996

[54] STACKED BARRIER-DIFFUSION SOURCE AND ETCH STOP FOR DOUBLE POLYSILICON BJT WITH PATTERNED BASE LINK

[75] Inventors: F. Scott Johnson; Kelly Taylor, both of Plano, Tex.

[73] Assignee: Texas Instruments Incorporated, Dallas, Tex.

[21] Appl. No.: 473,865

[22] Filed: Jun. 7, 1995

Related U.S. Application Data

[62] Division of Ser. No. 392,597, Feb. 23, 1995.

[51] Int. Cl.⁶ .............................. H01L 27/01; H01L 27/12
[52] U.S. Cl. ............................................. 257/588; 257/592
[58] Field of Search .................................... 257/587, 588, 257/592, 554

[56] References Cited

U.S. PATENT DOCUMENTS

| | | | |
|---|---|---|---|
| 5,109,262 | 4/1992 | Kadota et al. | 257/587 |
| 5,324,983 | 6/1994 | Onai et al. | 257/588 |
| 5,331,199 | 7/1994 | Chu et al. | 257/588 |
| 5,350,948 | 9/1994 | Maehara | 257/587 |
| 5,374,846 | 12/1994 | Takemura | 257/587 |
| 5,403,757 | 4/1995 | Suzuki | 257/588 |
| 5,430,317 | 7/1995 | Onai et al. | 257/588 |

*Primary Examiner*—Donald L. Monin, Jr.
*Attorney, Agent, or Firm*—Jacqueline J. Garner; Richard L. Donaldson; William E. Hiller

[57] ABSTRACT

A bipolar transistor (100) and a method for forming the same. A base-link diffusion source layer (118) is formed over a portion of the collector region (102). The base-link diffusion source layer (118) comprises a material that is capable of being used as a dopant source and is capable of being etched selectively with respect to silicon. A barrier layer (119) is formed over the base-link diffusion source layer (118). A base electrode (114) is formed over at least one end portion of the barrier layer (119) and base-link diffusion source layer (118) and the exposed portions of the barrier layer (119) and underlying base-link diffusion source layer (118) are removed. An extrinsic base region (110) is diffused from the base electrode (114) and a base link-up region (112) is diffused from the base-link diffusion source layer (118). Processing may then continue to form an intrinsic base region (108), emitter region (126), and emitter electrode (124).

6 Claims, 2 Drawing Sheets

STACKED BARRIER-DIFFUSION SOURCE AND ETCH STOP FOR DOUBLE POLYSILICON BJT WITH PATTERNED BASE LINK

This is a Division, of application Ser. No. 08/392,597 filed Feb. 23, 1995.

CROSS-REFERENCE TO RELATED APPLICATION

The following co-assigned patent application is hereby incorporated herein by reference:

| Ser. No. | Filing Date | Title |
| --- | --- | --- |
| (TI-19243) | 1/09/95 | A High Speed Bipolar Transistor Using A Patterned Etch Stop and Diffusion Source |

FIELD OF THE INVENTION

This invention generally relates to semiconductor structures and processes and more specifically to bipolar transistors.

BACKGROUND OF THE INVENTION

Bipolar transistors (BJTs) are commonly used in semiconductor devices especially for high speed operation and large drive current applications. A double polysilicon BJT 10 is shown in FIG. 1. The area for the BJT 10 is isolated by field oxides 12. The collector 14 is a lightly doped epitaxial layer of one conductivity type and the base region is formed by doped regions 16 and 18 of the opposite conductivity type. Doped region 16 is called the intrinsic base region and re,on 18 is the extrinsic base region. The extrinsic base region 18 provides an area for connecting to the base region. The base electrode 20 comprises a first doped polysilicon layer. The emitter region 22 is a doped region of the same conductivity type as the collector and is located within the intrinsic base region 16. The emitter electrode 24 is accomplished with a second doped polysilicon layer. Oxide region 26 and base-emitter spacers 28 isolate the emitter electrode 24 from the base electrode 20. Double polysilicon BJTs have the further advantage of lower base resistance and reduced extrinsic capacitances over single polysilicon BJTs. However, this advantage is gained by accepting additional process complexities such as those associated with the etching of polysilicon from the active device areas and the out diffusion of a base link-up doping region from a highly doped polysilicon diffusion source.

The BJT of FIG. 1 is typically formed by foxing a doped polysilicon layer and an oxide layer over a silicon active area (collector 14) and the field oxides 12. The polysilicon and oxide layers are then etched as shown in FIG. 2 to form the base electrode 20. However, because polysilicon is etched directly over the silicon active area, overetch and removal of some of silicon active area 14 occurs. This is due to the difficulty in selectively etching polysilicon with respect to silicon. This results in a non-planar active device area. The amount of overetch is difficult to control, causes surface roughness and causes defects and impurities in the surface.

Referring to FIG. 3, the extrinsic base region 18 is diffused from the first polysilicon layer (the base electrode 20). Base link-up (the linking between the extrinsic and intrinsic base regions) is accomplished by the out-diffusion from the base electrode 20. The intrinsic base region 16 is then implanted and the base-emitter spacers 28 are forced. The diffusion length for low resistance base link-up varies with the overetch. An "overlinked" base reduces the breakdown voltage of the emitter-base junction and "underlinked" base increases the resistance of the extrinsic base. Furthermore, the sheet resistance of the base electrode must be adjusted to control the depth of the extrinsic base region 18. The process continues with the formation of a second doped polysilicon layer that is subsequently etched to form the emitter electrode 24 and the diffusion of a dopant from the emitter electrode 24 to form the emitter region 22.

The advantages of the double polysilicon BJT must currently be balanced against the process complexities described above. Accordingly, there is a need for a method of foxing a BJT that reduces these process complexities.

SUMMARY OF THE INVENTION

A bipolar transistor and a method for forming the same are disclosed herein. A base-link diffusion source layer is formed over a portion of the collector region. The base-link diffusion source layer comprises a material that is capable of being used as a dopant source and is capable of being etched selectively with respect to silicon. A barrier layer is formed over the base-link diffusion source layer to protect it during subsequent processing. A base electrode is formed over at least one end portion of the barrier layer and base-link diffusion source layer and the exposed portions of the barrier layer and underlying base-link diffusion source layer are removed. Because the base-link diffusion source layer can be removed vary selectively with respect to the collector region (i.e., silicon), damage to this area (such as that which results from a less selective polysilicon etch) is avoided. An extrinsic base region is diffused from the base electrode and a base link-up region is diffused from the base-link diffusion source layer. Processing may then continue to form an intrinsic base region, emitter region, and emitter electrode.

An advantage of the invention is providing a method of forming a bipolar transistor that protects the base-link diffusion source layer from damage and overetching during processing.

A further advantage of the invention is providing a method of forming a bipolar transistor that eliminates the overetching and damage during the polysilicon portion of the emitter etch using a base-link diffusion source layer protected by a barrier layer.

These and other advantages will be apparent to those skilled in the art having reference to the specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention will now be described in conjunction with a double polysilicon bipolar transistor (BJT) formed using a BiCMOS process. It will be apparent to those skilled in the art that the invention is also applicable to other BiCMOS processes and devices as well as to bipolar processes and devices.

Figure 1:
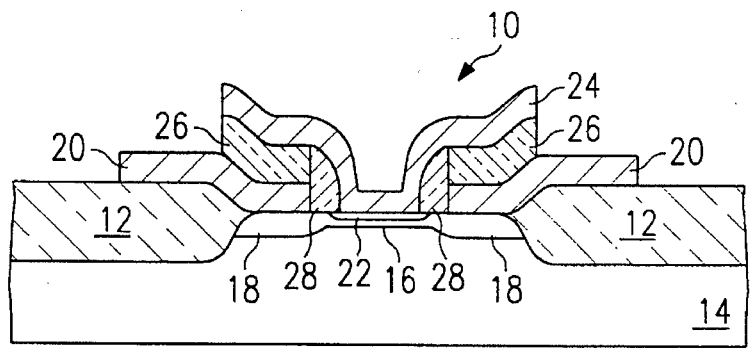
FIG. 1 is a cross-sectional diagram of a prior art BJT.
Figure 2:
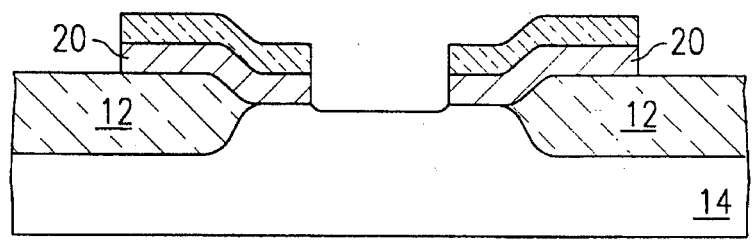
FIGS. 2–3 are cross-sectional diagrams of the prior art BJT of FIG. 1 at various stages of fabrication.
Figure 3:
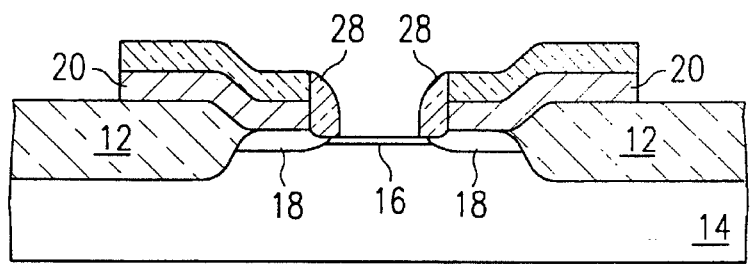
Figure 4:
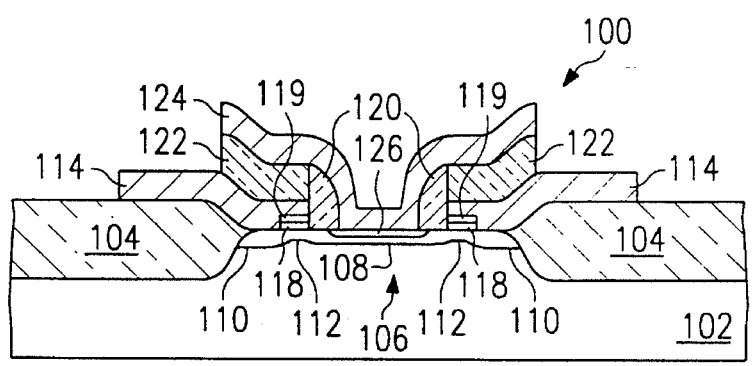
FIG. 4 is a cross-sectional diagram of a BJT according to the invention.

A BJT 100 according to the invention is shown in FIG. 4. Field insulating regions 104 isolate BJT 100 from other devices (not shown), such as other BJTs, MOS transistors, diodes and resistors, etc. Region 102 is a collector region. Many suitable collector regions are well known in the art. For example, collector region 102 may comprise a buried collector and a lightly doped epitaxial layer such as that described in U.S. Pat. No. 4,958,213, issued Sep. 18, 1990 and assigned to Texas Instruments, Inc.

The base region 106 consists of an intrinsic base region 108, an extrinsic base region 110, and a base link-up region 112. Intrinsic base region 108 is the region into which the emitter region is located. Extrinsic base region 110 provides an area for connection to the base region 106. Base link-up region 112 provides a low resistance connection between the extrinsic and intrinsic base regions (110, 108). The intrinsic, extrinsic, and base link-up regions (108, 110, and 112) all have the same conductivity type. For example, if the collector region 102 is n-type, the base regions 108, 110, and 112 are p-type. Alternatively, if the collector region 102 is p-type, the base regions 108, 110, and 112 are n-type.

Base electrode 114 comprises doped polysilicon and is connected to extrinsic base region 110. Base electrode 114 is the dopant source for forming extrinsic base region 110. Thus, for a NPN BJT, base electrode 114 is doped p-type. Alternatively, for a PNP BJT, base electrode 114 is doped n-type. The doping of base electrode 114 is adjusted to provide the desired conductivity for the base electrode. In contrast, prior art techniques required the doping of the base electrode to be adjusted based on providing a low resistance link-up region. Because base electrode 114 is not the dopant source for the base link-up region 112, the dopant concentration of the base electrode is uncoupled from the resistivity of the base link-up region 112.

Base-link diffusion source layer 118 is located below an end portion of base electrode 114 and is a dopant source for base-link-up region 112. Layer 118 comprises a material that is capable of acting as a dopant source for n-type and/or p-type dopants and may be selectively etched with respect to silicon. It should also be compatible with conventional semiconductor processing. Examples include silicate glass such as borosilicate glass (BSG) and phosphosilicate glass (PSG), as well as silicon-germanium (SiGe).

A barrier layer 119 is located on an upper surface of base-link diffusion source layer 118 between layer 118 and the base electrode 114 to protect layer 118 during processing. Process steps such as removal of photoresist masking layers (i.e., "strips") and clean-up may cause damage to base-link diffusion source layer 118. Barrier layer 119 also aids in maintaining stability of base-link diffusion source layer 118 by preventing exposure to air and water vapor prior to the formation of base electrode 114. Barrier layer 119 may, for example, comprises silicon dioxide or silicon nitride. Silicon nitride is used in the preferred embodiment.

Base-emitter spacers 120 provide the spacing between the ends of the emitter region 126 and the ends of the intrinsic base region 108. In addition, the combination of base-emitter spacers 120 and dielectric layer 122 isolate the emitter electrode 124 and the base electrode 114. Emitter electrode 124 preferably comprises doped polysilicon and is the dopant source for emitter region 126. Emitter electrode 124 has the opposite conductivity of base electrode 114.

Figure 5:
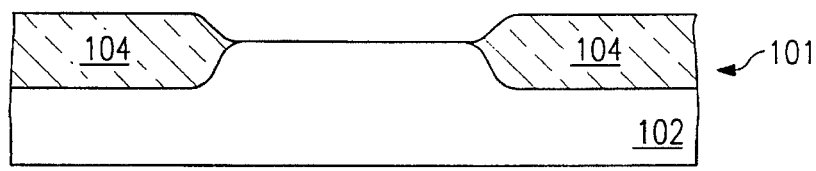
FIGS. 5–9 are cross-sectional diagrams of the BJT of FIG. 4 at various stages of fabrication.

FIG. 5 illustrates a semiconductor body 101 after the formation of collector region 102 and field insulating regions 104. Collector region 102 may comprise a buried layer, an epitaxial layer and a deep N+collector sink as is well known in the art. The formation of a BJT 100 according to the invention into the structure of FIG. 5 will now be described.

Figure 6:
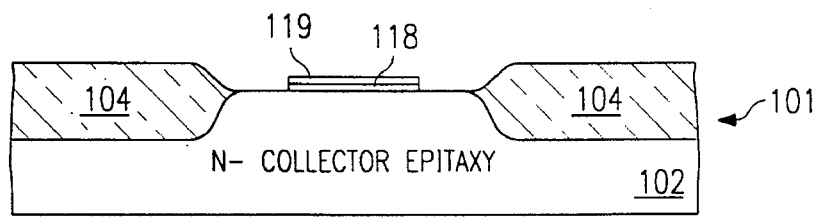

Referring to FIG. 6, a base-link diffusion source layer 118 is deposited over the structure of FIG. 5 to a thickness on the order of 500 Å. As discussed above, base-link diffusion source layer 118 comprises a material that may be etched selectively with respect to silicon and that may function as a dopant source for a base link-up region to be formed later in the process. It is immaterial whether layer 118 is insulating or conductive. Base-link diffusion source layer 118 is preferably doped in situ or implant doped after deposition. For example, base-link diffusion source layer may comprise BSG, PSG, or doped SiGe. The dopant concentration of base-link diffusion source layer 118 is determined by the desired resistance of base link-up region to be subsequently formed.

Next, a barrier layer 119 is deposited over base-link diffusion source layer 118 to a thickness in the range of 100–500 Å typically on the order of 300 Å. Barrier layer 119 comprises a material that will protect layer 118 during subsequent processing steps such as clean-ups and photoresist strips. These process steps can thin layer 118 to a less effective thickness and otherwise damage the layer. Barrier layer 119 will also help maintain the stability of layer 118 by preventing exposure to air and water vapor that can occur prior to the formation of base electrode 114. Barrier layer 119 may preferably comprise a dielectric such as silicon dioxide or silicon nitride.

Layers 118 and 119 are then patterned and etched using, for example, an oversized replica of the emitter pattern. The desired etching chemistry for layer 118 is highly selective with respect to silicon. Suitable etch chemistries will be apparent to those skilled in the art having reference to the specification. Because the etch of barrier layer 119 stops on layer 118, selectivity to silicon is not required in that part of the etch.

Figure 7:
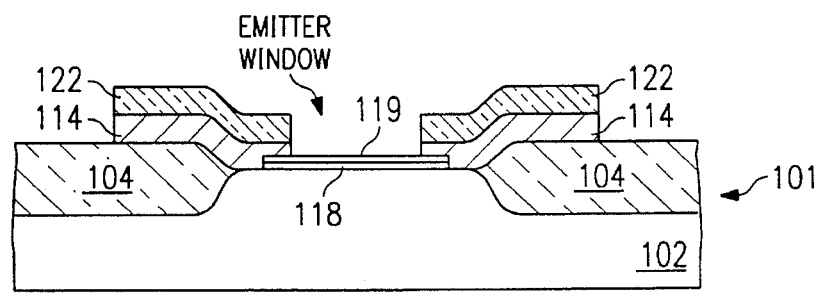

Next, a first layer of polysilicon and an interpoly dielectric are deposited to thickness on the order of 2K Å and 3K Å, respectively. The first layer of polysilicon may be doped insitu or implant doped after deposition so that a low resistance base electrode 114 may be formed therefrom. The first layer of polysilicon and the interpoly dielectric are then etched as shown in FIG. 7 to form the base electrode 114 and emitter window. The interpoly dielectric etch stops on the polysilicon and the polysilicon etch stops on barrier layer 119 or base-link diffusion layer 118. As a result, the active area is protected from overetching and crystal damage. As shown in FIG. 7, the base electrode 114 overlaps the ends of barrier layer 119 and base-link diffusion source layer 118. The amount of overlap varies by design but may be on the order of 0.2 μm. The pattern for layers 118 and 119 may overlap field oxide 104 on one or more sides to reduce device area. This leaves contact to the base region on less than four sides.

Figure 8:
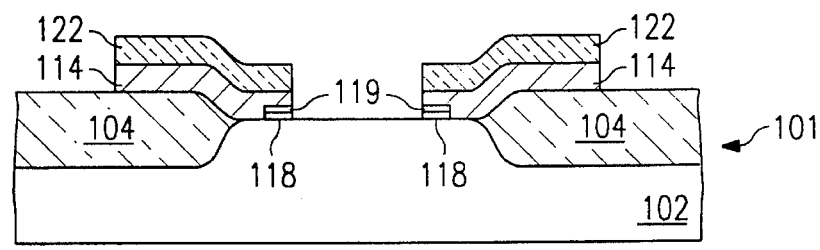
Figure 9:
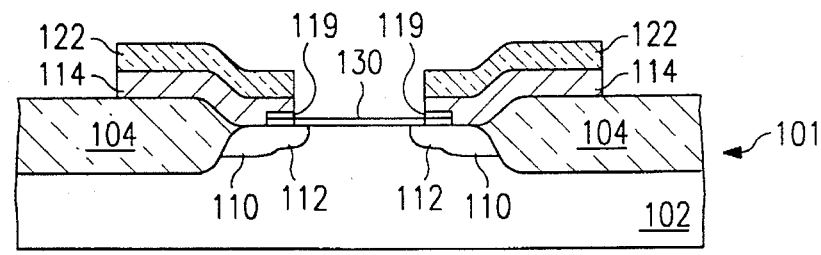

The exposed portion of barrier layer 119 and underlying base-link diffusion source layer 118 are then removed as shown in FIG. 8. For example, a selective dry etch may be used. However, the etch is highly selective against silicon. As a result, damage to the active area such as that which occurs when etching polysilicon directly off of silicon is avoided. An anneal cycle follows. The anneal is used to grow a screen oxide 130 while simultaneously diffusing the extrinsic base region 110 from the base electrode 114 and the base link-up region 112 from the remaining portions of base-link diffusion source layer 118. This is shown in FIG. 9. Because base link-up region 112 is diffused from base-link diffusion source layer 118, the dopant concentration of base link diffusion source layer 118 is adjusted to provide a low resistance base link-up region 112 without affecting the resistance of base electrode 114. The surface concentration of dopant at the interface is preferable on the order of $5E19/cm^3$.

Processing continues in a conventional manner to complete the structure of FIG. 4. Intrinsic base region 108 is implanted through screen oxide 130 and diffused. Base-emitter spacers 120 are then formed to space the edges of a subsequently formed emitter region from the intrinsic base region edges. Base-emitter spacers 120 may comprise, for example, silicon-dioxide. The second layer of polysilicon 132 is then deposited to thickness on the order of 2.5K Å. Polysilicon layer 132 may be doped in-situ or implant doped after deposition. Finally, the second polysilicon layer is patterned and etched to form the emitter electrode 124 and the emitter region 126 is diffused from the second polysilicon layer/emitter electrode either prior to or subsequent to the second polysilicon etch.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A bipolar transistor comprising:

a collector region;

an intrinsic base region within said collector region;

an extrinsic base region within said collector region;

a base link-up region within said collector region between said intrinsic base region and said extrinsic base region;

a base-link diffusion source layer above said base link-up region;

a barrier layer over said base-link diffusion source layer;

a base electrode overlying said barrier layer and said extrinsic base layer; and an emitter region within said intrinsic base region.

2. The bipolar transistor of claim 1, wherein said base-link diffusion source layer comprises a silicate glass.

3. The bipolar transistor of claim 1, wherein said barrier layer comprises silicon dioxide.

4. The bipolar transistor of claim 1, wherein said barrier layer comprises silicon nitride.

5. The bipolar transistor of claim 1, wherein said base-link diffusion source layer comprises silicon-germanium.

6. The bipolar transistor of claim 1, wherein said bipolar transistor comprises two layers of polysilicon.

\* \* \* \* \*